United States Patent [19]

Yoshida

[11] Patent Number: 4,873,458
[45] Date of Patent: Oct. 10, 1989

[54] VOLTAGE LEVEL DETECTING CIRCUIT HAVING A LEVEL CONVERTER

[75] Inventor: Takuji Yoshida, Tokyo, Japan

[73] Assignee: Oki Electric Industry Co., Ltd., Tokyo, Japan

[21] Appl. No.: 218,302

[22] Filed: Jul. 12, 1988

[30] Foreign Application Priority Data

Jul. 17, 1987 [JP] Japan .................... 62-177125

[51] Int. Cl.4 .................................. H03K 17/30
[52] U.S. Cl. .................... 307/362; 307/310; 307/451; 307/296.1
[58] Field of Search ............ 307/443, 451, 362–363, 307/296 R, 310; 323/314–316

[56] References Cited

U.S. PATENT DOCUMENTS

| 3,975,649 | 8/1976 | Kawagoe et al. | 307/310 X |
|---|---|---|---|
| 4,008,406 | 2/1977 | Kawagoe | 307/310 X |
| 4,293,782 | 10/1981 | Tanaka et al. | 307/310 X |
| 4,301,380 | 11/1981 | Thomas | 307/362 |
| 4,309,627 | 1/1982 | Tabata | 307/362 |
| 4,473,762 | 9/1984 | Iwahashi et al. | 307/443 X |
| 4,504,743 | 3/1985 | Aoyama et al. | 307/310 |

FOREIGN PATENT DOCUMENTS 0051317  3/1985  Japan .................... 307/362
61-60514 12/1986  Japan .

Primary Examiner—David Hudspeth
Attorney, Agent, or Firm—Wenderoth, Lind & Ponack

[57] ABSTRACT

A voltage level detecting circuit includes a resistance voltage divider, a level converter and an MOS driver arranged such that the detection characteristics are immune to temperature variations. The voltage divider has two resistive elements serially connected to each other to produce a divided voltage. The two resistive elements have different resistance variations to temperature change. The level converter has a threshold voltage and converts a divided voltage which is more than the threshold voltage from the voltage divider into a binary signal. The MOS driver produces a control signal on receipt of a binary signal from the level converter.

11 Claims, 3 Drawing Sheets

VOLTAGE LEVEL DETECTING CIRCUIT HAVING A LEVEL CONVERTER

BACKGROUND OF THE INVENTION

1. Field of the Invention

The present invention relates to a voltage level detecting circuit suitable for use in a semiconductor integrated circuit.

2. Description of the Prior Art

It is necessary to prevent an erroneous operation of a semiconductor integrated circuit, particularly an erroneous writing in a memory due to power supply voltage variations.

FIG. 5 shows a prior art voltage level detecting circuit which provides a binary signal by detecting the level of a power supply voltage. This circuit comprises a voltage divider 4 composed of a resistor r and three n-channel MOS transistors 41, 42 and 43 (hereinafter referred to simply as n-MOS transistors 41, 42 and 43) connected in series between the power supply voltage Vcc and ground Vss via the resistor r, and a CMOS inverter 5. The total ON-resistance value of the n-MOS transistors 41, 42 and 43 is significantly smaller than the resistance value of the resistor r.

The voltage level detecting circuit operates as follows. When the power supply voltage Vcc is less than the sum 3VT of the threshold voltages of the n-MOS transistors 41, 42 and 43, the n-MOS transistors 41, 42 and 43 are in OFF-state. Accordingly, the voltage divider 4 will provide a Vcc level or a 2VT level at the node via the resistor r. When the power supply voltage Vcc is greater than 3VT, the voltage divider 4 will provide a 2VT level at the node D. This is caused by the fact that two n-MOS transistors 42 and 43 are in an MOS diode connection.

If the CMOS inverter 5 has a threshold voltage of ½ Vcc, it produces a low level signal when the output node D is greater than ½ Vcc and a high level signal when the output node D is less than ½ Vcc. Accordingly, the detection level of the prior art voltage level detecting circuit is equal to four times the threshold voltage of the n-MO transistors.

In conclusion, the detection level of the prior art voltage level detecting circuit is determined by multiplication of the threshold voltage of the n-MOS transistors, the number of n-MOS transistors connected in series in the voltage divider 4 and the number of n-MOS transistors in the CMOS inverter 5.

The temperature characteristics of the prior art voltage level detecting circuit is described below.

FIG. 6 is a computer simulated graph showing the voltage variations of the nodes D and E with respect to the detected power supply voltage a temperatures of $-40°$ C. and $125°$ C. The prior art voltage level detecting circuit is extremely sensitive to temperature. The reason is that the voltage detection level is determined by the temperature sensitive threshold voltage of the n-MOS transistors. Provided that the temperature coefficient of the threshold is $-1.5$ mV/K, the power supply voltage level to be detected varies approximately 1.0 volt under the temperature variations of from $-40°$ C. to $125°$ C. ($165°$ C. in temperature difference), as shown by the following equation:

$(1.5 \times 10^{-3}) \times 4 \times (40 + 125) \approx 1.0$ volt.

As is evident from the abovenoted explanation, the prior art voltage level detecting circuit can not maintain an exact voltage detection level because it has large temperature dependent characteristics.

SUMMARY OF THE INVENTION

It is an object of the present invention to provide a voltage level detecting circuit which can detect stably a predetermined power supply voltage level over a wide range of temperature variations.

It is another object of the present invention to provide a voltage level detecting circuit which can output a control signal for controlling a writing circuit in a memory when a detected power supply voltage is lower than a predetermined level.

The object of the present invention is achieved by providing the voltage level detecting circuit comprising: a resistance voltage dividing circuit including a first resistive element connected between a power supply voltage and an output node, and a second resistive element connected between the output node and a ground potential for producing a divided voltage, the first resistive element having a resistance variation per temperature which is higher than that of the second resistive element; an MOS level converter connected between the power supply voltage and the ground potential, and having at least one MOS transistor for converting the divided voltage of the output node into a binary signal, the level converter comprising serially connected MOS transistors, and having a predetermined threshold voltage; and an MOS driver connected between the power supply potential and the ground voltage, for receiving the binary signal and for producing a control signal in response thereto.

The present voltage level detecting circuit is characterized in that the output level variation of a resistance voltage dividing circuit caused by a temperature variation is prevented by the threshold voltage variation of the MOS transistor in a level converter.

The above and other objects, features and advantages of the present invention will become more apparent from the following description taken in conjunction with the accompanying drawings.

DESCRIPTION OF THE PREFERRED EMBODIMENT

Preferred embodiments of the present invention will be described with reference to FIGS. 1 through 4.

Figure 1:
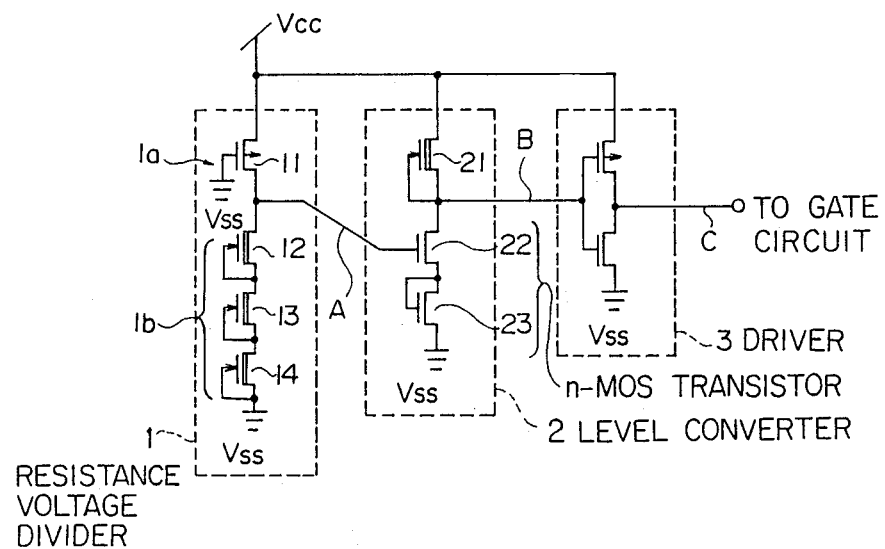
FIG. 1 is a circuit diagram showing a voltage level detecting circuit according to the first embodiment of the present invention.
Figure 3:
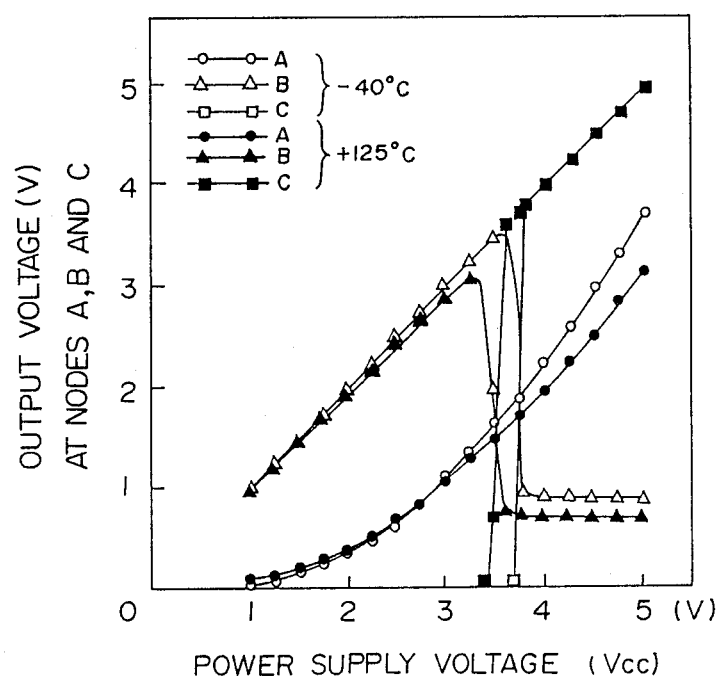
FIG. 3 is a graph showing a computer simulated output voltage vs power supply voltage characteristic, according to the first embodiment of the present invention.

First Embodiment (FIGS. 1 and 3)

Figure 2:
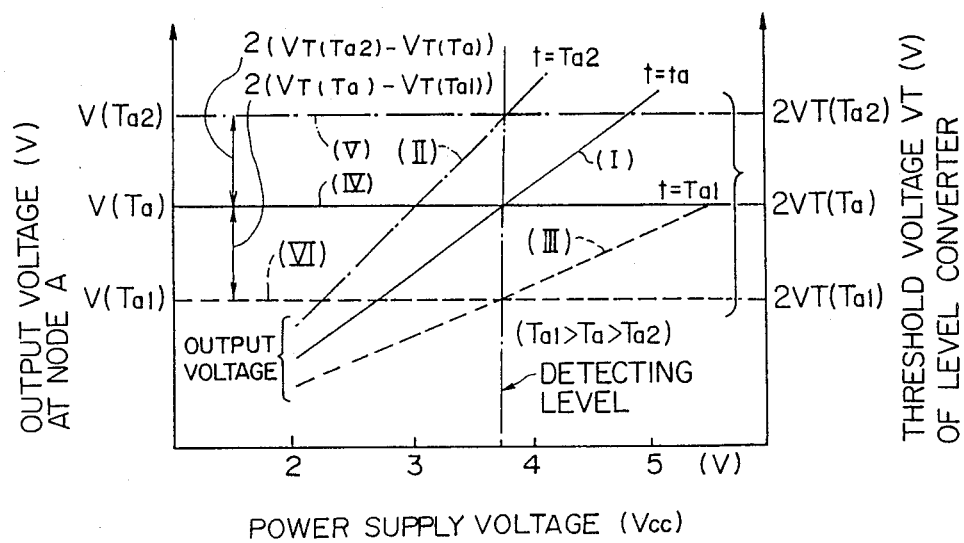
FIG. 2 is a graph showing temperature dependent characteristics of a voltage level detecting circuit according to the first embodiment of the present invention.

FIGS. 1 through 3 show a voltage level detecting circuit according to a first embodiment of the present invention.

The voltage level detecting circuit comprises three major elements.

A resistance voltage divider 1 comprises a first resistive element 1a composed of, for example, a p-channel MOS transistor 11, and a second resistive element 1b composed of, for example, three n-channel depletion-mode MOS transistors 12, 13, and 14 connected in series between the drain of the p-channel MOS transistor 11 and a ground potential Vss used as a reference voltage.

The first resistive element 1a has a drain connected to an output node A, a source connected to a power supply voltage Vcc to be detected and a gate connected to the ground potential Vss. The n-MOS transistor 14 has both a source and a gate connected to the ground potential Vss. The first resistive element 1a has a larger temperature dependent characteristic than that of the second resistive element 1b. The dividing ratio of the resistance voltage divider 1 is reduced as the ambient temperature rises. In other words, the first resistive element 1a has a larger resistance value variation than that of the second resistive element 1b.

An MOS level converter 2 comprises an n-channel MOS depletion-mode transistor 21 employed as a resistive element and at least one, for example, two n-channel enhancement-mode MOS transistors 22 and 23 connected in series. The n-MOS transistor 22 has a drain connected to the source of the n-MOS 21 and a source connected to the ground potential Vss used as a reference voltage.

The output node A of the resistance voltage divider 1 is connected to a gate of the n-MOS transistor 22 while the power supply voltage Vcc is connected to a drain of the n-MOS transistor 21. A junction between the n-MOS transistor 21 and the n-MOS transistor 22 forms an output node B of the level converter 2.

A CMOS driver 3 is composed of p and n MOS transistors serially connected to each other. The gates of the p and n MOS transistors are connected to the output node B of the level converter 2. The drains of the p and n MOS transistors are connected to the output node C. The CMOS driver 3 outputs a control signal, for example, an enabling signal to a gate circuit which controls the operation of logic circuits.

Operation of the voltage level detecting circuit according to the first embodiment is described below.

The resistance voltage divider 1 produces at the output node A a divided voltage determined by the resistance ratio between the first and second resistive elements 1a and 1b. When the power supply voltage Vcc exceeds the threshold voltage of the p-MOS transistor 11, the output voltage at the node A increases with the increase of the power supply voltage Vcc. For example, in case a detected power supply voltage is preset at 3.60 volts at an ambient temperature of 27° C., the voltage division ratio of the resistance voltage divider 1 is selected so as to provide twice (2VT) the threshold voltage (VT) of the n-MOS transistor 22 or 23.

Then, the output voltage of at the node B of the level converter 2 is determined as follows. When the divided voltage of the resistance voltage divider 1 is less than 2VT, the n-MOS transistors 22 and 23 will be in OFF-state whereby the output node B produces the Vcc level via n-MOS transistor 21. When the output node A of the resistance voltage divider 1 is greater than 2VT, the output node B produces the VT level provided that the sum of the resistance values of the n-MOS transistors 22 and 23 in ON-state are significantly smaller than the ON-resistance value of the n-MOS transistor 21. It is evident that the n-MOS 23 functions as an MOS diode. That is, the threshold voltage of the level converter 2 will be 2VT. The output voltage of the resistance voltage divider 1 is converted into a binary output signal, Vcc or VT, by the level converter 2.

Accordingly, a predetermined detection voltage level (3.60 volts according to this embodiment) is based on a voltage division ratio of the resistance voltage divider 1 and the threshold voltage of the n-MOS transistors 22 and 23.

The output node C of the CMOS driver 3 will be at a low level when the output B of the level converter 2 is at the Vcc level, and a high level when the output B of the level converter 2 is at the VT level. In accordance with the voltage level at the output node C, the voltage level detecting circuit detects whether or not a detected power supply voltage is higher than a predetermined detection voltage level.

The temperature characteristics of the voltage level detecting circuit will be described with reference to FIG. 2.

FIG. 2 is a graph showing both output voltage at node A vs power supply voltage characteristics and threshold voltage VT of level converter vs power supply voltage characteristics. The three lines (I), (II) and (III) show that the output voltage at the node A varies with temperatures Ta, Ta1 and Ta2 in which the relationship is Ta1 > Ta > Ta2. Also the three lines (IV), (V) and (VI) show that the total threshold voltage VT of the level converter 2 varies with temperatures Ta, Ta1 and Ta2. In FIG. 2, each of the lines (I), (II) and (III) intersects respectively each of the lines (V), (VI) and (IV) at a power supply voltage (e.g. 3.6 volts) to be detected.

When the temperature rises from Ta to Ta1, the output voltage at the node A of the resistance voltage divider 1 is decreased from V(Ta) to V(Ta1). At the same time, the threshold voltage of the level converter 2 is decreased from 2VT(Ta) to 2VT(Ta1) since the threshold voltage VT of the n-MOS transistors 22 and 23 is decreased from VT(Ta1) to VT(Ta).

Therefore, the detection voltage level can be kept constant by compensating for a decreased voltage [V(Ta)-V(Ta1)] at the output node A of the resistance voltage divider 1 with a decreased threshold voltage 2×[VT(Ta) −VT(Ta1)]of the level converter 2. That is, even if the output voltage level of the node A is varied with the temperature variations, the level converter 2 can perform an inverting operation at a specific detection level of the power supply voltage The detection voltage level can be also kept constant by compensating for the increased voltage [V(Ta2)−V(Ta)]at the output node A of the resistance voltage divider 1 with the increased threshold voltage 2×[VT(Ta2)−VT(Ta)]of the level converter 2. That is, the detection level of a power supply voltage is independent of the temperature variation.

FIG. 3 is a graph showing voltage variations of the output nodes A, B and C of the voltage level detecting circuit relative to power supply voltage variations at temperatures of −40° C. and 125° C., obtained by a computer simulation.

As shown in FIG. 3, the voltage level detecting circuit according to the present invention can provide a stable detection level (e.g. at or near 3.60 volts) over a wide range of temperature variations.

In FIG. 3, the output voltage variations of the CMOS driver 3 is very small at temperatures of $-40°$ C. to $125°$ C. It is evident from the difference that the voltage level detecting circuit of the present invention has an extremely low temperature dependency.

The detection level can be determined arbitrarily by changing the threshold voltage of the n MOS transistor, the number of the serially connected n-MOS transistors in the level converter and the resistance division ratio of the resistance voltage divider.

Figure 4:
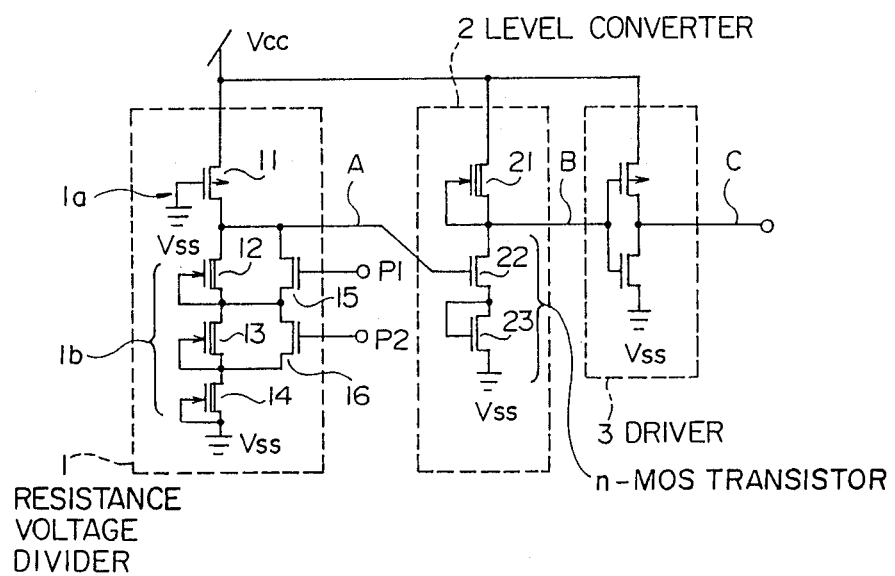
FIG. 4 is a circuit diagram showing a voltage level detecting circuit according to the second embodiment of the present invention.
Figure 5:
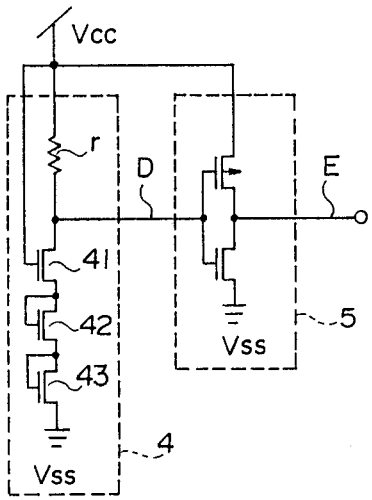
FIG. 5 is a circuit diagram showing a prior art voltage level detecting circuit.
Figure 6:
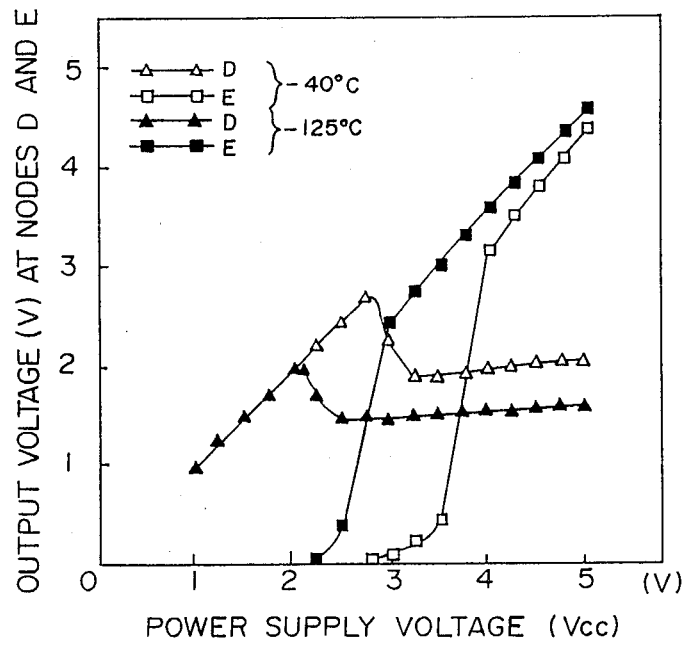
FIG. 6 is a graph showing a computer simulated output voltage vs power supply voltage characteristic, according to a prior art voltage level detecting circuit.

Second Embodiment (FIG. 4)

FIG. 4 shows a voltage level detecting circuit according to a second embodiment of the present invention.

In the voltage level detecting circuit of the second embodiment, additional n-MOS transistors 15 and 16 are respectively connected in parallel with the n-MOS transistors 12 and 13 of the resistance voltage divider 1. The n-MOS transistors 15 and 16 function as switches and the ON-resistance values of the n-MOS transistors 15 and 16 inputs are smaller than those of the n-MOS transistors 12 and 13. Accordingly, if the input P1 or P2 is at a high level, the n-MOS transistor 15 or 16 can change the resistance division ratio of the resistance voltage divider 1. A resistance voltage division ratio of the voltage divider 1 is determined by the p-MOS transistor 11 and the n-MOS transistors 13 and 14 when the input P1 is a high level, and by the p-MOS transistor 11 and the n-MOS transistors 12 and 14 when the input P2 is a low level, and furthermore by the p-MOS transistor 11 and the n-MOS transistor 14 when the inputs P1 and P2 are at high levels. The resistance values of the n-MOS transistors 15 and 16 are smaller than those of the n-MOS transistors 12 and 13. Accordingly, in the resistance voltage divider 1 as shown in FIG. 3, the resistance voltage division ratio can be varied by providing a bypass composed of the n-MOS transistors 15 and 16.

It is possible to fix the gate potential of the n-MOS transistors 15 and 16 after wafer fabrication by bonding the inputs P1 and P2 to the voltage Vcc or to ground by wire or by selectively melting fuses connected between the inputs P1 and P2, and the voltage Vcc.

Although the invention has been described in its preferred form with a certain degree of particularity, it is to be understood that many variations and changes are possible in the invention without departing from the scope thereof.

What is claimed is:

1. A voltage level detecting circuit comprising:
   a resistance voltage divider comprising a first resistive element connected between a power supply voltage and an output node and a second resistive element connected between said output node and a ground potential for producing a divided voltage, said first resistive element having a resistance variation with respect to temperature which is higher than that of said second resistive element;
   a level converter connected between said power supply voltage and said ground potential for converting said divided voltage of said output node into a binary signal having a high voltage signal level substantially equal to said power supply voltage and having a low voltage signal level substantially equal to said potential,
   wherein said level converter comprises serially connected MOS transistors having a predetermined switching threshold voltage, whereby the level converter converts said output node voltage into said high voltage signal level when said output node voltage is lower than said switching threshold voltage and converts said output node voltage into said low voltage signal level when said output node voltage is higher than said switching threshold voltage; and
   an MOS driver connected between said power supply voltage and said ground voltage for receiving said binary signal and for producing a control signal in response thereto.

2. A voltage level detecting circuit according to claim 1, wherein said resistance voltage divider comprises a P-channel MOS transistor having a source connected to said power supply voltage, a drain connected to said output node and a gate connected to said ground potential, and wherein said second resistive element comprises a plurality of N-channel depletion-mode MOS transistors which are connected so as to form source/drain circuits, each of said N-MOS transistors having a drain, a source and a gate connected to its source.

3. A voltage level detecting circuit according to claim 1, wherein said level converter comprises an N-channel depletion-mode MOS transistor having a source and employed as a resistive element and a plurality of N-channel enhancement-mode MOS transistors connected in series between said N-channel depletion-mode MOS transistor and said ground potential, the said N-channel depletion-mode MOS transistor having a drain connected to said power supply voltage and one of said N-channel enhancement-mode MOS transistors having a drain connected to said source of said N-channel depletion-mode MOS transistor and having a source and a gate connected to said first output node, and each of the remaining N-channel enhancement-mode MOS transistors having a source connected to said ground potential and having a gate and a drain connected to its gate.

4. A voltage level circuit according to claim 1, wherein said MOS driver comprises a CMOS inverter composed of a P-channel MOS transistor and an N-channel MOS transistor connected serially to said P-channel MOS transistor.

5. A voltage level detecting circuit according to claim 2, further comprising an N-channel enhancement-mode MOS transistor connected in parallel with a selected one of said N-channel depletion-mode MOS transistors.

6. A voltage level detecting circuit comprising:
   a resistance voltage divider comprising a first resistive element connected between a power supply voltage and an output node and a second resistive element connected between said output node and a ground potential for producing a divided voltage, said first resistive element having a resistance variation with respect to temperature which is higher than that of said second resistive element;
   a level converter connected between said power supply voltage and said ground potential for converting the divided voltage of the output node into a binary signal;

wherein said level converter comprises an output node, a resistor means connected between said power supply voltage and said output node of the level converter, a diode means having a first terminal connected to said ground potential and having a second terminal, and an MOS transistor connected between said output node of said level converter and said second terminal, said MOS transistor having a gate connected to said output node of said resistance voltage divider, and an MOS driver connected between said power supply voltage and said ground potential for receiving said binary signal and for producing a control signal in response thereto.

7. A voltage level detecting circuit according to claim 6, wherein said resistance voltage divider comprises a P-channel MOS transistor having a source connected to said power supply voltage, a drain connected to said output node and a gate connected to said ground potential; and wherein said second resistive element comprises a plurality of N-channel depletion-mode MOS transistors each of which has a drain, a source and a gate connected to its source, a source of preceding N-MOS transistor being connected to a drain of a following N-MOS transistor.

8. A voltage level detecting circuit according to claim 6, wherein said MOS driver comprises a CMOS inverter consisting of a P-channel MOS transistor and an N-channel MOS transistor, serially connected to said P-channel MOS transistor.

9. A voltage level detecting circuit according to claim 7, further comprising an N-channel enhancement-mode MOS transistor connected in parallel with a selected one of said plurality of N-channel depletion-mode MOS transistors.

10. A voltage level detecting circuit according to claim 7, wherein said resistor means comprises an N-channel depletion-mode MOS transistor having a gate connected to said output node of said level converter.

11. A voltage level detecting circuit according to claim 7, wherein said diode means comprises an N-channel enhancement-mode MOS transistor having a gate connected to a drain thereof.

* * * * *